US009502609B2

(12) United States Patent
Bedell et al.

(10) Patent No.: US 9,502,609 B2
(45) Date of Patent: Nov. 22, 2016

(54) SIMPLIFIED PROCESS FOR VERTICAL LED MANUFACTURING

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/744,602

(22) Filed: Jun. 19, 2015

(65) Prior Publication Data

US 2016/0284928 A1     Sep. 29, 2016

Related U.S. Application Data

(63) Continuation of application No. 14/668,397, filed on Mar. 25, 2015.

(51) Int. Cl.
*H01L 33/00*     (2010.01)
(52) U.S. Cl.
CPC ... *H01L 33/0079* (2013.01); *H01L 2933/0033* (2013.01)
(58) Field of Classification Search
CPC .. H01L 33/0079; H01L 33/005; H01L 33/02
USPC .......................................................... 438/26
See application file for complete search history.

(56) References Cited

U.S. PATENT DOCUMENTS

| 8,247,261 | B2 | 8/2012 | Bedell et al. |
| 8,278,645 | B2 | 10/2012 | Hong et al. |
| 2010/0258813 | A1 | 10/2010 | Lee et al. |
| 2010/0311250 | A1 | 12/2010 | Bedell et al. |
| 2011/0159771 | A1* | 6/2011 | Yamazaki .......... H01L 27/1214 445/24 |
| 2013/0193466 | A1 | 8/2013 | Sudhiranjan et al. |
| 2014/0084254 | A1 | 3/2014 | Li et al. |
| 2014/0217356 | A1 | 8/2014 | Bayram et al. |

OTHER PUBLICATIONS

S.W. Bedell et al., "Vertical light-emitting diode fabrication by controlled spalling," Applied Physics Express, vol. 6, Oct. 2013, 112301.
Y.C. Lin et al., "Warpage and stress relaxation of the transferred GaN LED epi-layer on electroplated Cu substrates," Electronic Materials Letters, vol. 9, No. 4, Jul. 2013, pp. 441-444.
C N. Han et al., "Sapphire-removed induced the deformation of high power InGaN light emitting diodes," International Conference on Thermal, Mechanical and Multi-Physics Simulation and Experiments in Microelectronics and Micro-Systems, EuroSimE, Apr. 2008.
S. Kim et al., "Stress behavior of electrodeposited copper films as mechanical supporters for light emitting diodes." Electrochimica Acta, vol. 52, No. 16, Feb. 2007, pp. 5258-5265.

\* cited by examiner

*Primary Examiner* — Tran Tran
(74) *Attorney, Agent, or Firm* — Vazken Alexanian; Michael J. Chang, LLC

(57) ABSTRACT

Techniques for integrating spalling into layer transfer processes involving optical device semiconductor materials are provided. In one aspect, a layer transfer method for an optical device semiconductor material includes forming the optical device semiconductor material on a first substrate; depositing a metal stressor layer on top of the optical device semiconductor material; attaching a first handle layer to the metal stressor layer; removing the optical device semiconductor material from the first substrate by pulling the first handle layer away from the first substrate; attaching a second handle layer to the optical device semiconductor material; removing the first handle layer from the stack; and forming a second substrate on the stressor layer. Vertical LED devices and techniques for formation thereof are also provided.

16 Claims, 3 Drawing Sheets

SIMPLIFIED PROCESS FOR VERTICAL LED MANUFACTURING

CROSS-REFERENCE TO RELATED APPLICATION(S)

This application is a continuation of U.S. application Ser. No. 14/668,397 filed on Mar. 25, 2015, the disclosure of which is incorporated by reference herein.

FIELD OF THE INVENTION

The present invention relates to improved layer transfer processes and more particularly, to techniques for integrating spalling into layer transfer processes involving optical device semiconductor materials, such as in the production of vertical light emitting diodes (LEDs), and implementation of electrodeposition or other techniques to forego substrate bonding during vertical LED manufacture.

BACKGROUND OF THE INVENTION

A light emitting diode (LED) employs a forward biased p-n junction. Vertical LEDs are a relatively new concept as are the methods for their manufacture. With vertical LEDs, the layers of the device are typically arranged in a stack, hence the term vertical. The layers of a vertical LED often include an active layer in between p-type and n-type semiconductor layers.

A common method for fabricating vertical LEDs is by removing a layer of gallium nitride (GaN) that has been grown on a sapphire substrate and bonding it to a new (thermally conductive) substrate. The GaN layers are often transferred from the growth substrate onto another substrate (e.g., molybdenum (Mo), copper-tungsten (CuW) or aluminum silicon (AlSi) wafers) by first fabricating the devices on the GaN surface, and then bonding the surface of the substrate containing the finished devices to a handle substrate using a metallic bonding process. A typical metallic bonding process used is transient liquid phase (TLP) bonding which involves relatively thick layers of precious metals (e.g., indium (In), gold (Au), and/or silver (Ag)). Thus, one drawback of this wafer bonding process is the use of precious metals which are expensive and thus raise production costs.

After depositing these metal bonding layers on the surface of the wafers, they are brought into contact (often in vacuum) with a force applying mechanism, and heated to the melting point of one of the metallic layer materials (usually In). Another drawback to this wafer bonding process is that small particles may be present on the bonding surfaces (e.g., as a result of common epitaxial growth processes used to form an LED) which will suppress bonding in that region—thereby affecting device yield.

Accordingly, improved techniques are needed for transferring GaN (or other optical device layers) from their growth substrate onto a new handle substrate.

SUMMARY OF THE INVENTION

The present invention provides techniques for integrating spalling into layer transfer processes involving optical device semiconductor materials, such as in the production of vertical light emitting diodes (LEDs), and implementation of electrodeposition or other techniques to forego substrate bonding during vertical LED manufacture. In one aspect of the invention, a layer transfer method for an optical device semiconductor material is provided. The method includes the steps of: forming the optical device semiconductor material on a first substrate; depositing a metal stressor layer on top of the optical device semiconductor material, wherein the metal stressor layer is deposited to a thickness sufficient to permit mechanically-assisted spalling of the optical device semiconductor material to occur; attaching a first handle layer to the metal stressor layer; removing the optical device semiconductor material from the first substrate by pulling the first handle layer away from the first substrate and with it a stack comprising the metal stressor layer and the optical device semiconductor material; attaching a second handle layer to the optical device semiconductor material; removing the first handle layer from the stack; and forming a second substrate on the stressor layer, wherein the second substrate includes a metal selected from the group including: nickel, copper, silver, aluminum, zinc, tin, and combinations thereof.

In another aspect of the invention, a method for forming a vertical light emitting diode (LED) device is provided. The method includes the steps of: forming an optical device semiconductor material on a first substrate; forming a vertical LED stack on top of the optical device semiconductor material; depositing a metal stressor layer on top of the vertical LED stack, wherein the metal stressor layer is deposited to a thickness sufficient to permit mechanically-assisted spalling of the optical device semiconductor material to occur; attaching a first handle layer to the metal stressor layer; removing the vertical LED stack and the optical device semiconductor material from the first substrate by pulling the first handle layer away from the first substrate and with it a stack comprising the metal stressor layer, the vertical LED stack, and the optical device semiconductor material; attaching a second handle layer to the optical device semiconductor material; removing the first handle layer from the stack; and forming a second substrate on the stressor layer, wherein the second substrate includes a metal selected from the group including: nickel, copper, silver, aluminum, zinc, tin, and combinations thereof.

In yet another aspect of the invention, a vertical LED device is provided. The vertical LED device includes: a substrate, wherein the substrate includes a metal selected from the group including: nickel, copper, silver, aluminum, zinc, tin, and combinations thereof; a metal stressor layer disposed directly on the substrate; a vertical LED stack disposed on the metal stressor layer; and an optical device semiconductor material disposed on the vertical LED stack.

A more complete understanding of the present invention, as well as further features and advantages of the present invention, will be obtained by reference to the following detailed description and drawings.

DETAILED DESCRIPTION OF PREFERRED EMBODIMENTS

Figure 1:
FIG. 1 is a cross-sectional diagram illustrating an optical device semiconductor material having been formed on a first substrate according to an embodiment of the present invention.

As provided above, conventionally employed wafer bonding processes used for transferring optical device layers (such as gallium nitride (GaN)) from a growth substrate to a handle wafer (such as during the fabrication of vertical light emitting diodes (LEDs) have several notable drawbacks in that they often involve use of costly precious metals and contamination of the bonding surfaces can undesirably occur to the detriment of the bonding process. Advantageously, provided herein are techniques for transferring optical device layers (such as GaN) from a growth substrate to a handle wafer that forego a traditional wafer bonding process, thus reducing manufacturing costs and improving reliability of the finished product.

Specifically, according to the present techniques, thick substrate electroplating is used to obviate the need for substrate bonding. This approach is a thermal (i.e., does not involve heating), insensitive to particulates, and potentially much cheaper than TLP-type bonding. An exemplary embodiment of the present techniques for transferring an optical device layer(s) from a growth substrate to a handle wafer is now described by way of reference to FIGS. 1-8.

To begin the process, an optical device semiconductor material 102 is provided on a first substrate 104. See FIG. 1. By way of example only, the optical device semiconductor material 102 includes, but is not limited to silicon (Si), germanium (Ge), gallium arsenide (GaAs), gallium nitride (GaN), aluminum nitride (AlN), indium phosphide (InP), or silicon carbide (SiC). Sapphire, SiC, or bulk GaN are suitable substrates for growth (e.g., epitaxial, chemical vapor deposition (CVD), etc.) of these optical device semiconductor materials. The conditions for growth of these device semiconductor materials on a sapphire, SiC, or bulk GaN substrate are known to those of skill in the art, and as such are not described in further detail herein. Thus, according to an exemplary embodiment, the first substrate 104 is a sapphire, SiC, or bulk GaN substrate on which the device semiconductor material 102 is grown. In that case, the first substrate 104 may also be referred to herein as a "growth substrate."

An example will be provided below where the present techniques are implemented in the production of a vertical light emitting diode (LED). In that example, one or more additional optical device (active/contact) layers will be formed as a stack on the semiconductor material 102, and transferred along with the semiconductor material 102 from the growth substrate to a handle wafer. Thus, the depiction of a single layer of optical device semiconductor material 102 in FIGS. 1-8 is provided merely as one example of how the present techniques are performed.

Next, a first handle layer is used to remove at least a portion of the optical device semiconductor material 102 from the first substrate 104. According to an exemplary embodiment, a controlled spalling process is used to remove the optical device semiconductor material 102 (or a portion thereof) from the first substrate 104. The process of substrate spalling is described, for example, in U.S. Patent Application Publication Number 2010/0311250 by Bedell et al., entitled "Thin Substrate Fabrication Using Stress-Induced Substrate Spalling" (hereinafter "U.S. Patent Application Publication Number 2010/0311250"), the contents of which are incorporated by reference as if fully set forth herein. As described in U.S. Patent Application Publication Number 2010/0311250, substrate spalling involves depositing a layer of metal under tensile strain on the surface of a substrate and, if this 'stressor layer' is made thick enough, stress at the edge of the stressor layer/source substrate interface exceeds the fracture strength of the substrate and a fracture propagates into the source substrate (the source substrate in this case being the optical device semiconductor material) at a distance below, and parallel to, the surface of the source substrate. Accordingly, a portion of the source substrate surface attached to the stressor layer can be peeled off the source substrate.

Figure 2:
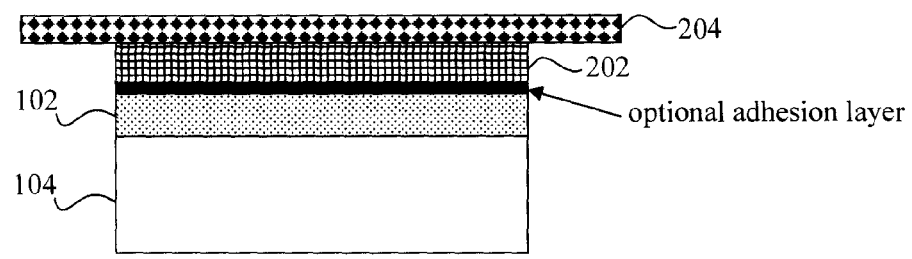
FIG. 2 is a cross-sectional diagram illustrating a stressor layer having been formed on the optical device semiconductor material according to an embodiment of the present invention.

Specifically, as shown in FIG. 2, a stressor layer 202 is formed on top of the optical device semiconductor material 102 opposite the first substrate 104. According to an exemplary embodiment, the stressor layer 202 is formed by depositing one or more metal (stressor) layers on the optical device semiconductor material 102. Suitable metals for forming the stressor layer 202 include, but are not limited to, nickel (Ni), cobalt (Co), chromium (Cr) and/or iron (Fe). According to an exemplary embodiment, the stressor layer 202 is deposited on the optical device semiconductor material 102 using evaporation, sputtering, electrodeposition, or combinations thereof. It is preferable that the stressor layer 202 is formed to a thickness that is less than that at which spontaneous spalling occurs, but thick enough to permit mechanically assisted spalling to occur (such as when the first handle layer is pulled away from the first substrate 104—see below). By way of example only, a stressor layer 202 having a thickness of from about 1 micrometer (µm) to about 50 µm, and ranges therebetween, meets this requirement.

Optionally, as shown in FIG. 2, an adhesion layer may be used between the optical device semiconductor material 102 and the stressor layer 202. Suitable materials for forming the adhesion layer include, but are not limited to, titanium (Ti), tungsten (W), Cr and/or Ni. According to an exemplary embodiment, the adhesion layer has a thickness of from about 5 nanometers (nm) to about 500 nm, and ranges therebetween. When an adhesion layer is present, the stressor layer 202 may also be deposited using an electroplating process. For example, evaporation or sputtering may be employed to deposit the adhesion layer on the optical device semiconductor material 102. The stressor layer can then be electroplated onto top of the adhesion layer.

Next, a first handle layer 204 is attached to the stressor layer 202. As provided above, this first handle layer 204 will permit, via the stressor layer 202, at least a portion of the optical device semiconductor material 102 to be removed from the first substrate 104. According to an exemplary embodiment, the first handle layer 204 is formed from a pressure-sensitive adhesive tape, such as a metal or plastic foil that is bonded to the stressor layer 202 using for example silicone or acrylic based pressure-sensitive adhesives, epoxy resin, thermocompression bonding, etc.

Figure 3:
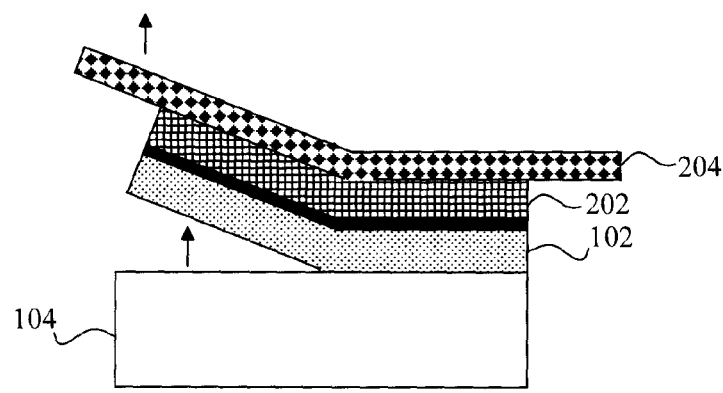
FIG. 3 is a cross-sectional diagram illustrating mechanically assisted spalling being used to remove at least a portion of the optical device semiconductor material from the first substrate according to an embodiment of the present invention.
Figure 4:
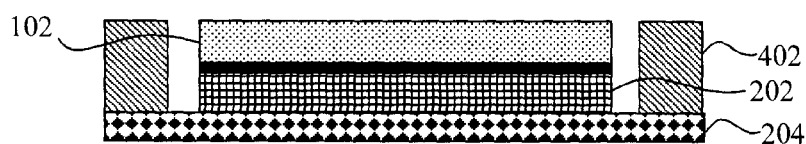
FIG. 4 is a cross-sectional diagram illustrating the handle layer, and the stack of materials including the stressor layer and optical device semiconductor material having been flipped according to an embodiment of the present invention.
Figure 5:
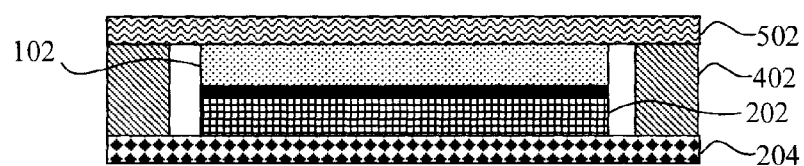
FIG. 5 is a cross-sectional diagram illustrating a second handle layer having been attached to the optical device semiconductor material according to an embodiment of the present invention.

As shown in FIG. 3, mechanically assisted spalling is used to remove (i.e., peel off) at least a portion of the optical device semiconductor material 102 from the first substrate 104. Namely by pulling the first handle layer 204 away from the first substrate 104, the stressor layer 202 and optical device semiconductor material 102 attached thereto can be peeled off the first substrate 104.

Once removed from the first substrate 104, the handle layer 204, and the stack of materials including the stressor layer 202 and optical device semiconductor material 102 are flipped such that the handle layer 204 is below the stack (i.e., below the stressor layer 202), and the optical device semiconductor material 102 is on top of the stressor layer 202. See FIG. 4. Preferably a frame 402 (e.g., a commercially available wafer frame or other suitable support structure) is placed on the handle layer 204 and around the stressor layer 202/optical device semiconductor material 102. The frame 402 will provide support for the layers during the subsequent processing steps.

As will become apparent from the following description, the handle layer 204 which is currently adjacent to the stressor layer 202 will be removed in order to permit the formation of a second substrate on the stressor layer 202. Accordingly, to permit the (first) handle layer 204 to be removed, a second handle layer 502 is next attached to the optical device semiconductor material 102. See FIG. 5. According to an exemplary embodiment, handle layer 502 is formed from a polymeric material, such as a polyimide, polyethylene terephthalate (PET), polycarbonates, ethylene polymers and copolymers, or fluorocarbon polymers and copolymers. Further, any of these polymeric handle materials may be coupled with a pressure-sensitive adhesive, so as to form a pressure-sensitive adhesive tape which can be applied to the optical device semiconductor material 102. Preferably, the adhesive used is releasable (thermally-, UV-releasable, etc.) to permit the second handle layer 502 to be removed (if so desired) later in the process.

Figure 6:
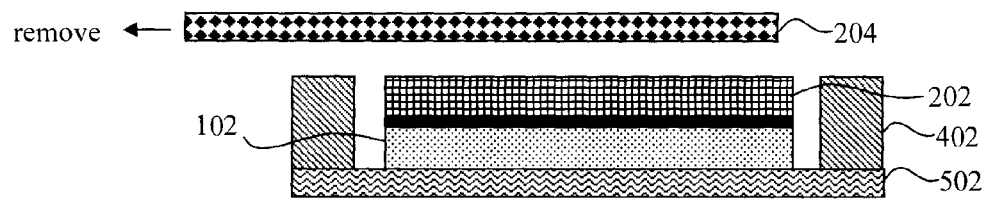
FIG. 6 is a cross-sectional diagram illustrating the stressor layer/optical device semiconductor material stack having been flipped and the first handle layer having been removed according to an embodiment of the present invention.
Figure 7:
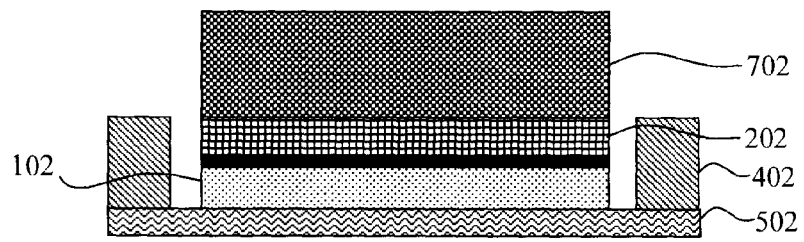
FIG. 7 is a cross-sectional diagram illustrating a second substrate having been formed on the (now exposed) stressor layer according to an embodiment of the present invention.

Application of the (second) handle layer 502 allows the stressor layer 202/optical device semiconductor material 102 stack to be flipped and the (first) handle layer 204 to be removed. See FIG. 6. As shown in FIG. 6, after the stack is flipped the optical device semiconductor material 102 is now present on top of the handle layer 502 (i.e., the handle layer 502 is below the stack), and the stressor layer 202 is present on a side of the optical device semiconductor material 102 opposite the handle layer 502. As provided above, the handle layer 204 can be bonded to the stressor layer 202 layer using, for example, pressure-sensitive tape. Many commercially available tapes are thermally releasable, and thus heat can be applied to the stack (according to the manufacturer's specifications) to release the handle layer 204 from the stressor layer 202. Any other suitable techniques known in the art for removing the handle layer 204 from the stressor layer 202 may be similarly employed, e.g., use of a UV releasable adhesive, etc.

A second substrate 702 is then formed on the (now exposed) side of the stressor layer 202 opposite the optical device semiconductor material 102. See FIG. 7. In one exemplary embodiment, the second substrate 702 is formed from a metal or metals and is formed on the stressor layer 202 using electroplating. Suitable metals for forming the second substrate 702 include, but are not limited to, nickel (Ni), copper (Cu), silver (Ag), aluminum (Al), zinc (Zn), tin (Sn), and combinations thereof.

Electroplating is favorable since it is an athermal process (thus avoiding damage high temperatures can cause to the structure), fast, does not involve compressive pressure (typical in wafer bonding processes), etc. Thus, the above-described drawbacks to the TLP process can be avoided altogether by use of the present alternative to conventional wafer bonding processes.

According to the exemplary embodiment described above, the stressor layer 202 is formed from a metal(s) such as Ni, Co, Cr and/or Fe. In that case, the metal stressor layer can serve as the cathode for the electroplating process. Namely, the structure can be placed in an electrolyte (e.g., in a plating bath), and a potential applied across the cathode and anode of the corresponding material for the second substrate 702 (e.g., Ni, Cu, Ag, Al, Zn, and/or Sn). According to an exemplary embodiment, the second substrate 702 is formed to a thickness of from about 50 µm to about 500 µm, and ranges therebetween, on the stressor layer 202.

For uniformity during formation of the second substrate 702, it is preferable to provide a flat surface onto which the metal can be plated. Accordingly, a vacuum chuck (or any other suitable method) can be used for holding the stack flat during the electroplating process.

While favorable, electroplating is not the only process that may be used to form the second substrate 702 on the stressor layer 202 in accordance with the present techniques. For instance, spray coating is a suitable alternative method for forming the second substrate 702. One type of suitable spray coating method that may be employed is thermal spraying wherein the respective metal (e.g., Ni, Cu, Ag, Al, Zn, and/or Sn (see above)) is softened or made molten using heat and then atomized and sprayed onto the surface of the stressor layer 202—forming the second substrate 702.

Figure 8:
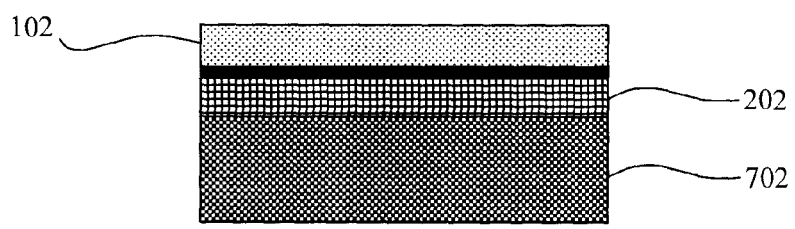
FIG. 8 is a cross-sectional diagram illustrating the second substrate/stressor layer/optical device semiconductor material stack having been flipped, and the second handle layer having been removed according to an embodiment of the present invention.

As shown in FIG. 8, for use and/or further processing, the second substrate 702/stressor layer 202/optical device semiconductor material 102 stack can be removed from the frame 402, flipped, and the (second) handle layer 502 can be removed. As provided above, the handle layer 502 can be affixed to the optical device semiconductor material 102 using a releasable (thermally-, UV-releasable, etc.) adhesive to facilitate removal of the handle layer 502 at this stage in the process. The stressor layer 202 is now present on the second substrate 702, and the optical device semiconductor material 102 is present on a side of the stressor layer 202 opposite the second substrate 702. Accordingly, after flipping the second substrate 702 is present below the stack. This structure can be used as a platform for a variety of different device applications involving an optical device semiconductor material, such as photovoltaic devices.

As highlighted above, one exemplary implementation of the present techniques contemplated herein is in the production of vertical LEDs. An exemplary methodology for forming a vertical LED in accordance with the present techniques is now described by way of reference to FIG. 9. In this example, the vertical LED will include an active layer (i.e., the layer which emits light) sandwiched between an n-type doped contact layer and a p-type doped contact layer. According to an exemplary embodiment, each of these active/contact layers will be formed from an optical device semiconductor material (e.g., Si, Ge, GaAs, GaN, AlN, InP, SiC—see above) using an epitaxial growth process. Epitaxial growth of these optical device semiconductor materials is preferably templated from a lattice-matched (i.e., growth) substrate—such as first substrate 104 in the above example. As provided above, sapphire, SiC or bulk GaN for example, are suitable growth substrates for the present GaN-based optical device semiconductor materials. These growth substrates however are thermally insulating and thus would lead to heat dissipation issues if employed in the completed device. Accordingly, the present techniques can be used to leverage the advantages of the growth substrate to grow one or more of the optical device semiconductor materials which can then be removed and the optical device semiconductor materials transferred from a first to a second handle (i.e., handle layers 204 and 502, respectively) and a thermally conductive substrate (i.e., the second substrate 702) can be formed for use in the final vertical LED device.

Figure 9:
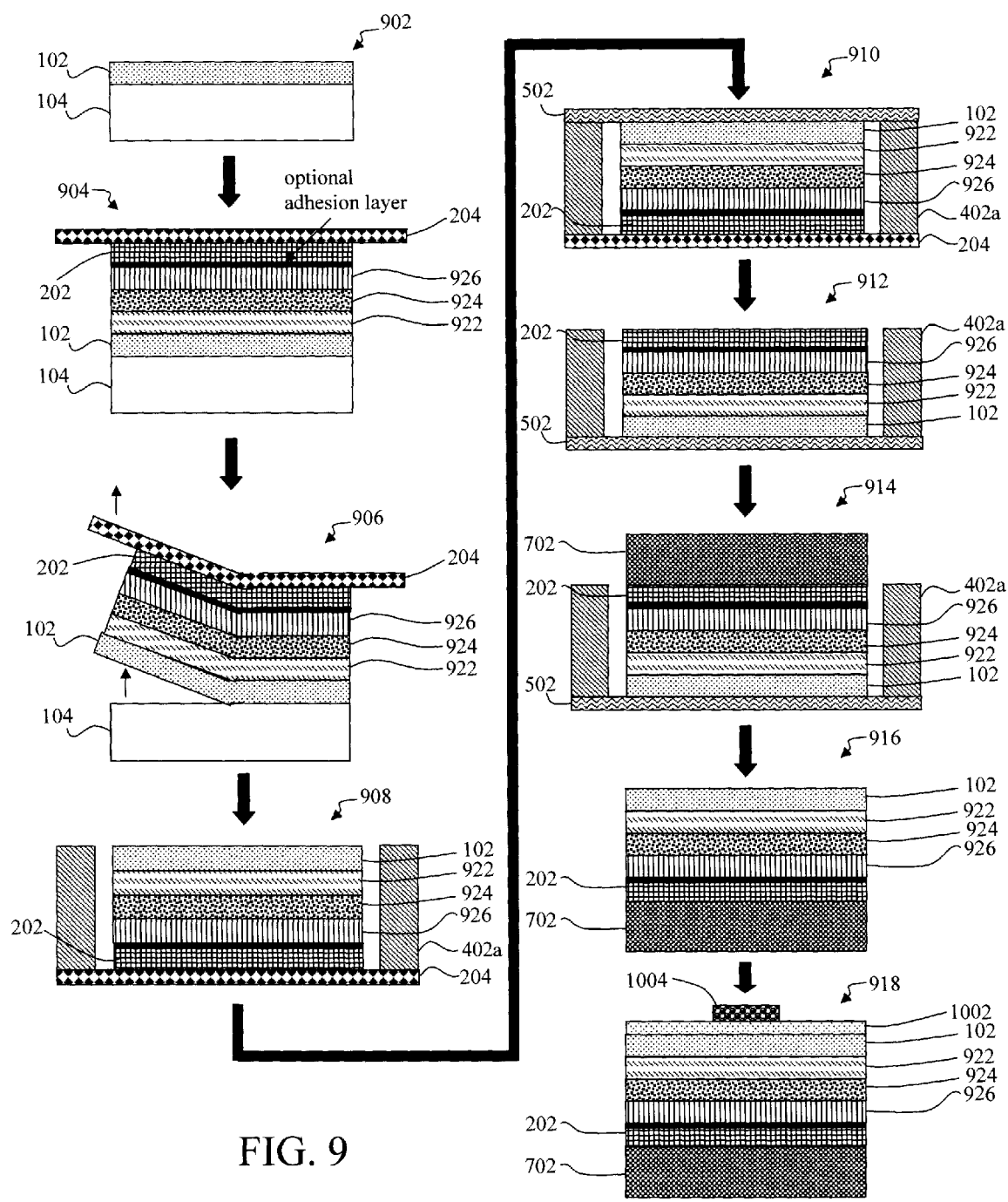
FIG. 9 is a diagram illustrating an exemplary methodology for forming a vertical light emitting diode (LED) according to an embodiment of the present invention.

For clarity and consistency, in the process depicted in FIG. 9 like structures are given the same reference numerals as in the previous figures. As shown in FIG. 9, the process begins in step 902 with the same starting structure as above, namely an optical device semiconductor material 102 (e.g., Si, Ge, GaAs, GaN, AlN, InP, or SiC) on a first substrate 104. According to an exemplary embodiment, the first substrate 104 is a growth substrate such as a sapphire, SiC, or bulk GaN substrate, and the optical device semiconductor material 102 is grown on the first substrate 104 (using, e.g., epitaxy, CVD, etc.).

By contrast to the embodiment presented above, in step 904 multiple active/contact layers of the vertical LED stack are next formed (e.g., epitaxially grown) on the optical device semiconductor material 102. The growth of these LED layers will be templated from the optical device semiconductor material 102. In the example shown in FIG. 9, an epitaxial n-type doped contact layer 922 is grown on the optical device semiconductor material 102. According to an exemplary embodiment, optical device semiconductor material 102 is undoped GaN, and contact layer 922 is formed from n-type doped GaN. The contact layer 922 may be in-situ doped with an n-type impurity (such as silicon (Si)) during the epitaxial growth process. Next, an epitaxial active layer 924 is grown on the n-type doped contact layer 922. According to an exemplary embodiment, active layer 924 is formed from multiple layers of InGaN as well as AlGaN electron blocking layers. An epitaxial p-type doped contact layer 926 is grown on a the active layer 924. According to an exemplary embodiment, p-type doped contact layer 926 is formed from p-type doped GaN. Again, the contact layer 926 may be in-situ doped with an p-type impurity (such as magnesium (Mg)) during the epitaxial growth process. This stack of active/contact layers 922-926 of optical device semiconductor materials forms the vertical LED stack.

Next, a first handle layer is used to remove active/contact layers 922-926 and at least a portion of the optical device semiconductor material 102 from the first substrate 104 using, e.g., a spalling process. The details of a spalling process were provided above. In general, a metal stressor layer 202 (e.g., Ni, Co, Cr, and/or Fe) is formed (e.g., using evaporation or sputtering) on the vertical LED stack (i.e., on a side of the p-type doped contact layer 926 opposite the active layer 924). As detailed above, the stressor layer 202 is preferably formed to a thickness that is less than that at which spontaneous spalling occurs, but thick enough to permit mechanically assisted spalling to occur (such as when the first handle layer is pulled away from the first substrate 104—see below). By way of example only, a stressor layer 202 having a thickness of from about 1 µm to about 50 µm, and ranges therebetween, meets this requirement. Optionally, an adhesion layer (e.g., a Ti, W, Cr and/or Ni layer) may be used between the optical device semiconductor material 102 and the stressor layer 202. According to an exemplary embodiment, the adhesion layer has a thickness of from about 5 nm to about 500 nm, and ranges therebetween. As provided above, when the optional adhesion layer is present, the stressor layer 202 can also be electroplated onto the adhesion layer.

A first handle layer 204 is next attached to the stressor layer 202. As provided above, this first handle layer 204 will permit, via the stressor layer 202, the active/contact layers 922-926 (i.e., the vertical LED stack) and at least a portion of the optical device semiconductor material 102 to be removed from the first substrate 104. As above, the first handle layer 204 may be formed from a metal or plastic foil that is bonded to the stressor layer 202 using for example a pressure-sensitive adhesive, epoxy resin, thermocompression bonding, etc.

In step 906, mechanically assisted spalling is used to peel off the active/contact layers 922-926 (i.e., the vertical LED stack) and at least a portion of the optical device semiconductor material 102 from the first substrate 104. Namely by pulling the first handle layer 204 away from the first substrate 104, the stressor layer 202 and the active/contact layers 922-926 and optical device semiconductor material 102 attached thereto can be peeled off the first substrate 104.

Once removed from the first substrate 104, in step 908 the handle layer 204, stressor layer 202, the active/contact layers 922-926, and optical device semiconductor material 102 are flipped such that the handle layer 204 is on the bottom, the stressor layer 202 is present on the handle layer 204, the p-type doped contact layer 926 is present on a side of the stressor layer 202 opposite the handle 204, the active layer 924 is present on a side of the p-type doped contact layer 926 opposite the stressor layer 202, the n-type doped contact layer 922 is present on a side of the active layer 924 opposite the p-type doped contact layer 926, and the optical device semiconductor material 102 is present on a side of the n-type doped contact layer 922 opposite the active layer 924. A frame is preferably placed on the handle layer 204 and around the stressor layer 202/layers 922-926/optical device semiconductor material 102. In order to accommodate the larger stack of layers, a larger frame will be needed. Accordingly, in this example, the frame is given the reference numeral 402a.

In step 910, a second handle layer 502 is next attached to the optical device semiconductor material 102 (i.e., a side of the optical device semiconductor material 102 opposite the n-type doped contact layer 922). As above, the handle layer 502 may be formed from a polymeric material, such as a polyimide, PET, polycarbonates, ethylene polymers and copolymers, or fluorocarbon polymers and copolymers, and may be coupled with a pressure-sensitive adhesive, so as to form a pressure-sensitive adhesive tape which can be applied to the optical device semiconductor material 102. Preferably, the adhesive used is releasable (thermally-, UV-releasable, etc.) to permit the second handle layer 502 to be removed (if so desired) later in the process.

In step 912, the stack is flipped such that the optical device semiconductor material 102 is now present on top of the handle layer 502, the n-type doped contact layer 922 is present on a side of the optical device semiconductor material 102 opposite the handle layer 502, the active layer 924 is present on a side of the n-type doped contact layer 922 opposite the optical device semiconductor material 102, the p-type doped contact layer 926 is present on a side of the active layer 924 opposite the n-type doped contact layer 922, and the stressor layer 202 is present on a side of the p-type doped contact layer 926 opposite the active layer 924. The handle layer 204 is then removed from the stressor layer 202.

In step 914, a second substrate 702 is then formed on the (now exposed) side of the stressor layer 202 opposite the vertical LED stack (i.e., on a side of the stressor layer opposite the p-type doped contact layer 926). In one exemplary embodiment, the second substrate 702 is formed from a metal or metals (e.g., Ni, Cu, Ag, Al, Zn, and/or Sn) and is formed on the stressor layer 202 using electroplating. A vacuum chuck (or any other suitable method) can be used to hold the stack flat during the electroplating process. According to an exemplary embodiment, the second substrate 702 is formed to a thickness of from about 50 μm to about 500 μm, and ranges therebetween, on the stressor layer 202. Alternatively, a different deposition process, such as spray coating, may be used to form the second substrate 702.

In step 916, the stack can be removed from the frame 402a and flipped such that the stressor layer 202 is present on the second substrate 702, the p-type doped contact layer 926 is present on a side of the stressor layer 202 opposite the second substrate 702, the active layer 924 is present on a side of the p-type doped contact layer 926 opposite the stressor layer 202, the n-type doped contact layer 922 is present on a side of the active layer 924 opposite the p-type doped contact layer 926, and the optical device semiconductor material 102 is present on a side of the n-type doped contact layer 922 opposite the active layer 924. The handle layer 502 can be removed.

Any further processing may be carried out, for example (in the case of a vertical LED) to form a transparent conductor and/or top electrode on the stack. Namely to complete the vertical LED, in step 918 standard processes may be employed to form a transparent conductor 1002 on the optical device semiconductor material 102, and a top electrode 1004 on the transparent conductor 1002. Suitable materials for forming the transparent conductor 1002 include, but are not limited to, transparent conductive oxides such as indium-tin-oxide (ITO). Suitable materials for forming the top electrode 1004 include, but are not limited to, contact metals such as titanium (Ti), aluminum (Al), copper (Cu), platinum (Pt), gold (Au), etc.

As is evident from the above description, in vertical LEDs manufactured using the present process the final substrate (i.e., the second substrate 702 in the above examples) is formed directly on (and in direct contact with) the stressor layer (i.e., stressor layer 202). Thus, there are no intervening bonding layers, intermetallic layers, etc. between the final/second substrate 702 and the stressor layer 202. By comparison, with conventional substrate bonding processes, such as TLP, bonding layers would be present (see above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A layer transfer method for an optical device semiconductor material, comprising the steps of:
   forming the optical device semiconductor material on a first substrate;
   depositing a metal stressor layer on top of the optical device semiconductor material, wherein the metal stressor layer is deposited to a thickness sufficient to permit mechanically-assisted spalling of the optical device semiconductor material to occur;
   attaching a first handle layer to the metal stressor layer;
   removing the optical device semiconductor material from the first substrate by pulling the first handle layer away from the first substrate and with it a stack comprising the metal stressor layer and the optical device semiconductor material;
   attaching a second handle layer to the optical device semiconductor material;
   removing the first handle layer from the stack; and
   forming a second substrate on the stressor layer, wherein the second substrate comprises a metal selected from the group consisting of: nickel, copper, silver, aluminum, zinc, tin, and combinations thereof.

2. The method of claim 1, wherein the optical device semiconductor material comprises silicon, germanium, gallium arsenide, gallium nitride, aluminum nitride, indium phosphide, or silicon carbide.

3. The method of claim 1, wherein the first substrate comprises a sapphire, silicon carbide, or bulk gallium nitride growth substrate, the method further comprising the step of:
   growing the optical device semiconductor material on the first substrate.

4. The method of claim 1, wherein the metal stressor layer comprises one or more of nickel, cobalt, chromium, and iron.

5. The method of claim 1, wherein the thickness sufficient to permit mechanically-assisted spalling of the optical device semiconductor material to occur comprises the metal stressor layer having a thickness of from about 1 μm to about 50 and ranges therebetween.

6. The method of claim 1, further comprising the steps of:
   depositing a metal adhesion layer on the optical device semiconductor material; and
   electroplating the metal stressor layer on the adhesion layer.

7. The method of claim 6, wherein the metal adhesion layer comprises one or more of titanium, tungsten, chromium, and nickel.

8. The method of claim 1, wherein the second substrate is formed on the stressor layer using electroplating.

9. The method of claim 1, wherein the second substrate is formed on the stressor layer using spray coating.

10. The method of claim 1, further comprising the step of:
    flipping the stack such that the second substrate is below the stack.

11. A method for forming a vertical light emitting diode (LED) device, comprising the steps of:
    forming an optical device semiconductor material on a first substrate;
    forming a vertical LED stack on top of the optical device semiconductor material;
    depositing a metal stressor layer on top of the vertical LED stack, wherein the metal stressor layer is deposited to a thickness sufficient to permit mechanically-assisted spalling of the optical device semiconductor material to occur;
    attaching a first handle layer to the metal stressor layer;
    removing the vertical LED stack and the optical device semiconductor material from the first substrate by pulling the first handle layer away from the first substrate and with it a stack comprising the metal stressor layer, the vertical LED stack, and the optical device semiconductor material;

attaching a second handle layer to the optical device semiconductor material;

removing the first handle layer from the stack; and forming a second substrate on the stressor layer, wherein the second substrate comprises a metal selected from the group consisting of: nickel, copper, silver, aluminum, zinc, tin, and combinations thereof.

12. The method of claim 11, further comprising the step of:

flipping the stack such that the second substrate is below the stack.

13. The method of claim 11, wherein the step of forming the vertical LED stack on the optical device semiconductor material comprises the steps of:

forming an n-type doped contact layer on the optical device semiconductor material;

forming an active layer on the n-type doped contact layer; and forming a p-type doped contact layer on the active layer.

14. The method of claim 13, wherein the n-type doped contact layer, the active layer, and the p-type doped contact layer are each formed using an epitaxial growth process.

15. The method of claim 11, wherein the second substrate is formed on the stressor layer using electroplating.

16. The method of claim 11, wherein the second substrate is formed on the stressor layer using spray coating.

* * * * *